(12) United States Patent
Shen et al.

(10) Patent No.: US 11,791,161 B2
(45) Date of Patent: *Oct. 17, 2023

(54) PATTERN FIDELITY ENHANCEMENT (71) Applicant: Taiwan Semiconductor Manufacturing Co., Ltd., Hsin-Chu (TW)

(72) Inventors: Yu-Tien Shen, Tainan (TW); Ya-Wen Yeh, Taipei (TW); Wei-Liang Lin, Hsin-Chu (TW); Ya Hui Chang, Hsinchu (TW); Yung-Sung Yen, New Taipei (TW); Wei-Hao Wu, Hsinchu (TW); Li-Te Lin, Hsinchu (TW); Ru-Gun Liu, Hsinchu County (TW); Kuei-Shun Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 238 days.

This patent is subject to a terminal disclaimer.

(21) Appl. No.: 17/114,070

(22) Filed: Dec. 7, 2020

(65) Prior Publication Data

US 2021/0118674 A1   Apr. 22, 2021

Related U.S. Application Data (62) Division of application No. 15/689,172, filed on Aug. 29, 2017, now Pat. No. 10,861,698.

(51) Int. Cl.
| | | |
|---|---|---|
| *G03F 7/09* | (2006.01) | |
| *H01L 21/027* | (2006.01) | |
| *H01L 21/033* | (2006.01) | |
| *H01L 21/311* | (2006.01) | |
| *H01L 21/306* | (2006.01) | |
| *G03F 7/20* | (2006.01) | |
| *G03F 7/11* | (2006.01) | |

(52) U.S. Cl.
CPC ............ *H01L 21/0273* (2013.01); *G03F 7/09* (2013.01); *H01L 21/0337* (2013.01); *H01L 21/311* (2013.01); *G03F 7/11* (2013.01); *G03F 7/20* (2013.01); *H01L 21/0274* (2013.01); *H01L 21/306* (2013.01)

(58) Field of Classification Search
CPC ..... G03F 7/09; G03F 7/11; G03F 7/20; G03F 7/36
See application file for complete search history.

(56) References Cited

U.S. PATENT DOCUMENTS

| | | | |
|---|---|---|---|
| 7,927,945 | B2 | 4/2011 | Lee |
| 8,796,666 | B1 | 8/2014 | Huang et al. |
| 9,012,132 | B2 | 4/2015 | Chang |
| 9,028,915 | B2 | 5/2015 | Chang et al. |
| 9,093,530 | B2 | 7/2015 | Huang et al. |
| 9,146,469 | B2 | 9/2015 | Liu et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 10,049,918 | B2 | 8/2018 | Hung et al. |
| 10,658,184 | B2 | 5/2020 | Shen et al. |
| 2002/0162629 | A1 | 11/2002 | Jeon et al. |
| 2007/0028205 | A1 | 2/2007 | Nakano et al. |
| 2009/0170261 | A1 | 7/2009 | Lee |
| 2009/0298293 | A1 | 12/2009 | Knotter et al. |

FOREIGN PATENT DOCUMENTS

| | | |
|---|---|---|
| CN | 109791874 A | 5/2019 |
| JP | H0882915 A | 3/1996 |
| TW | I221337 | 9/2004 |
| TW | 201532141 A | 8/2015 |
| WO | 0067302 A1 | 11/2000 |

*Primary Examiner* — Daborah Chacko-Davis
(74) *Attorney, Agent, or Firm* — HAYNES AND BOONE, LLP (57) ABSTRACT

The present disclosure provides a method for semiconductor manufacturing in accordance with some embodiments. The method includes providing a substrate and a patterning layer over the substrate and forming a plurality of openings in the patterning layer. The substrate includes a plurality of features to receive a treatment process. The openings partially overlap with the features from a top view while a portion of the features remains covered by the patterning layer. Each of the openings is free of concave corners. The method further includes performing an opening expanding process to enlarge each of the openings and performing a treatment process to the features through the openings. After the opening expanding process, the openings fully overlap with the features from the top view.

20 Claims, 12 Drawing Sheets

PATTERN FIDELITY ENHANCEMENT

PRIORITY DATA

This is a divisional application of U.S. patent application Ser. No. 15/689,172, filed Aug. 29, 2017, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the issue of pattern corner rounding has become more prominent in smaller process nodes. Pattern corner rounding refers to the phenomenon that right angles in a design pattern become rounded during photolithography (e.g., photoresist pattern) and etching processes (e.g., hard mask patterns). This issue directly affects the process window and pattern fidelity, such as critical dimension (CD) variation control, during semiconductor manufacturing. Hence, there is a need for methods that can reduce the impact of pattern corner rounding on pattern fidelity and improve process window.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to forming a pattern or device for an integrated circuit (IC) using photolithography (or lithography) processes, and more particularly to methods for overcoming pattern corner rounding issues and enhancing pattern fidelity during photolithography processes.

Figure 1:
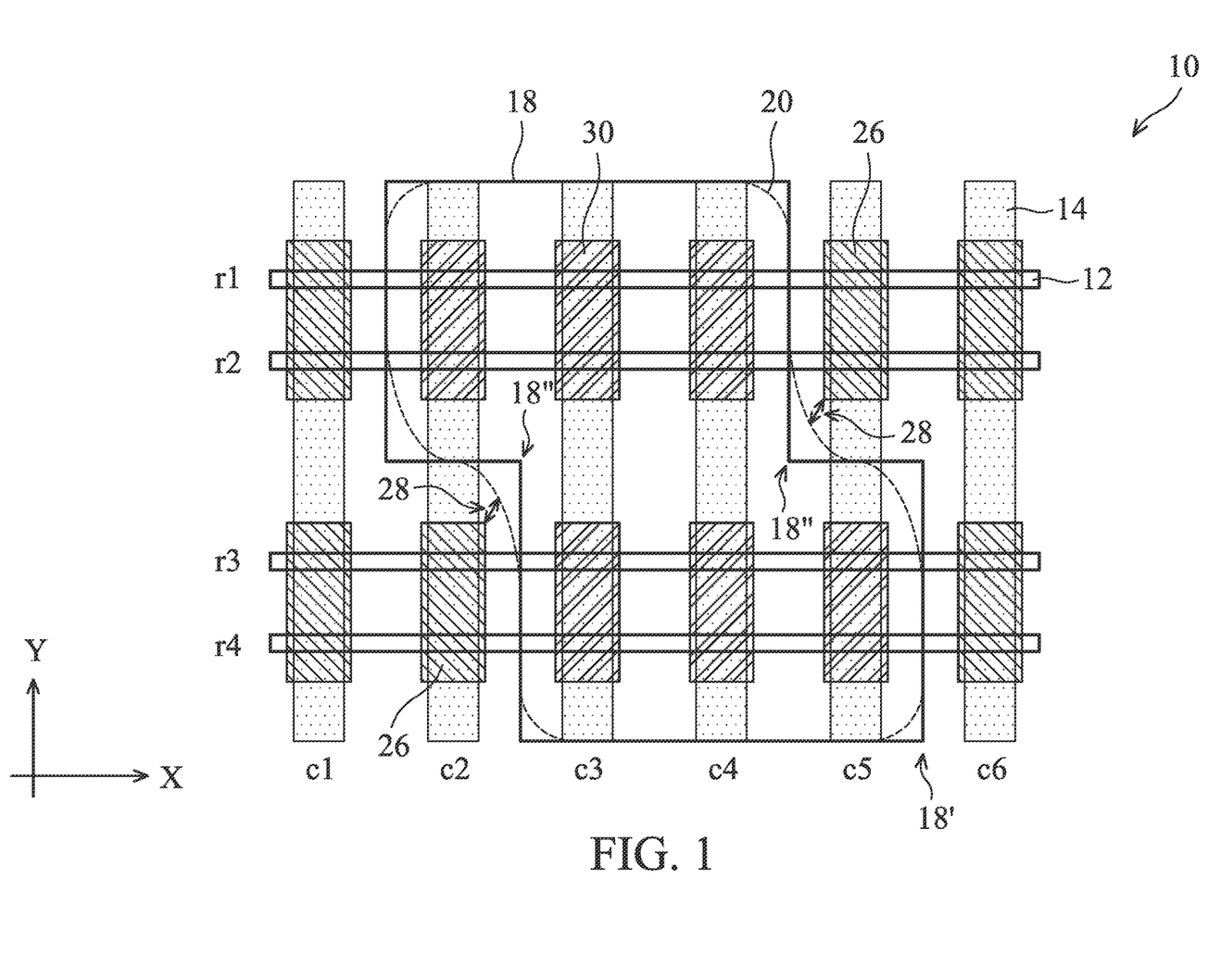
FIG. 1 illustrates an integrated circuit design according to an embodiment of the present disclosure.

FIG. 1 illustrates a layout of an IC 10 according to an embodiment of the present disclosure. Referring to FIG. 1, the IC 10 includes a plurality of active regions 12 oriented lengthwise along the X direction, and a plurality of gate structures 14 oriented lengthwise along the Y direction perpendicular to the X direction. At each intersection of the active regions 12 and the gate structures 14, a field effect transistor (FET) is formed. In an embodiment, the active regions 12 have a fin-like shape and the FETs formed thereon are fin field effect transistor (FinFETs). The illustrated example in FIG. 1 shows four rows (r1, r2, r3, and r4) of active regions 12 and six columns (c1, c2, c3, c4, c5, and c6) of the gate structures 14, which jointly form 24 FETs. In some designs, there is a need that some of the transistors have different physical and/or electrical characteristics than the others. For example, the transistors that are enclosed by the box 18 (transistor type-1) may have a different threshold voltage (Vt) than those outside the box 18 (transistor type- 2). For example, transistor type-1 may be designed to have high Vt, while transistor type-2 may be designed to have low Vt. This may be desirable, for example, in SRAM cell designs and/or peripheral circuit designs.

To implement the IC 10, one approach is to form a masking element that covers the transistors of type-2, while exposing and processing the transistors of type-1 (i.e. the box 18 represents an opening in a masking element), or alternatively covers the transistors of type-1 (i.e. the box 18 represents a masking element covering the region beneath), while processing the transistors of type-2, during certain processing stages, such as ion implantation. The masking element may comprise a resist material or a hard mask material, and may be made through photolithography processes. The boundary formed by the box 18 may sit right in the middle of adjacent features, i.e., between the gate structures 14 horizontally and between the active regions 12 vertically. In the example shown in FIG. 1, the box 18 includes six right-angle convex corners (outer corners) 18' and two right-angle concave corners (inner corners) 18". A convex corner may be referred to a corner of a region, where the corner has two line segments intersecting at a vertex, while a straight line connecting any pair of points on the two line segments is within the region. A concave corner may be referred to as a corner of a region, where the corner has two line segments intersecting at a vertex, while at least a straight line connecting a pair of points on the two line segments is outside the region. As to be explained later on, concave or convex corners may become rounded after photolithography processes. For the sake of simplicity, rounded concave corners and rounded convex corners may be still referred to as concave corners and convex corners, respectively. In various embodiments, the shape of the box 18 may be simpler or more complex than the one shown in FIG. 1. The shape of the box 18 represents an example target pattern to be formed through photolithography processes.

Ideally, the actual masking element conforms to the exact dimensions of the target pattern (e.g., the box 18). However, due to optical effects and/or etching bias during the photolithography processes, the masking element typically does not conform to the target pattern exactly. Instead, the contour 20 of the actual masking element has rounded corners, which brings boundaries of the masking element closer to some of the IC features, especially at the concave corners 18". This reduced distance represents lost design margins. FIG. 1 further shows regions 26 around the transistors. The regions 26 represent areas that the contour 20 of the masking element may not touch. For example, the regions 26 may account for process variations such as critical dimension variations and overlay variations. A closer distance between the contour 20 and the regions 26 is usually found at the concave corners 18" than at the convex corners 18'. The closest distance between the contour 20 and the regions 16 represents the design margin, such as the distance 28 in the illustrated example in the FIG. 1. FIG. 1 also shows regions 30 around the transistors. The regions 30 represent areas that the contour 20 of the masking element has to surround. As the dimensions of the IC continue to scale down, it becomes more and more desirable for methods that can form the contour 20 of the actual masking element being free of concave corners, such as by transforming the target pattern (e.g., the box 18) into a set of sub-patterns free of concave corners, while meeting the masking and unmasking requirements of specific regions (e.g., the regions 26 and 30, respectively), throughout lithography patterning processes. The present disclosure provides one or more embodiments that address the concave corner rounding issues in lithography patterning processes. The provided subject matter can be applied to various IC designs in addition to or alternative to the IC 10.

Figure 2:
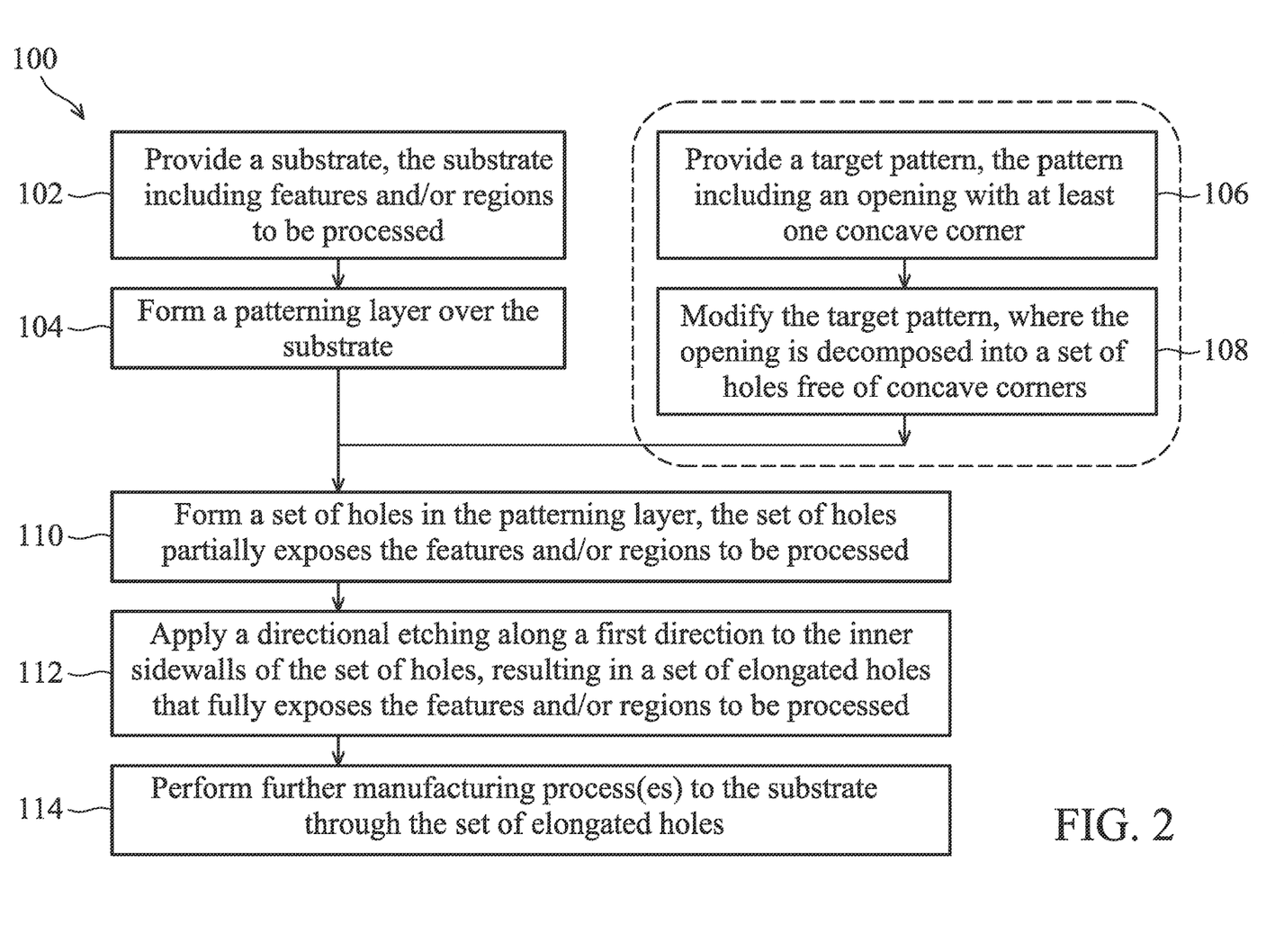
FIG. 2 illustrates a flow chart of a method for overcoming corner rounding issues according to an embodiment of the present disclosure.

Referring to FIG. 2, shown therein is a flow chart of a method 100 for forming a hole-type pattern having a plurality of holes (or openings) that is free of concave corners with the aid of directional etching technique. The method 100 is an example, and is not intended to limit the present disclosure beyond what is explicitly recited in the claims. Additional operations can be provided before, during, and after the method 100, and some operations described can be replaced, eliminated, or moved around for additional embodiments of the method.

In various embodiments, the method 100 forms a plurality of openings to partially expose device features to receive further treatments (e.g., etching or ion implantation) and then applies directional etching to expand each of the plurality of openings to fully expose device features. In some embodiments, each opening may have a shape of a substantial rectangle with rounded corners, thereby avoiding concave corners in the hole-type pattern. Further, the method 100 can be used to form hole-type resist patterns or hole-type hard mask (HM) patterns. FIGS. 3A-10A and 3B-10B illustrates top and cross-sectional views, respectively, of a device 200 during various manufacturing steps according to a first embodiment of the method 100, wherein a target hole-type pattern with concave corners is modified to a hole-type pattern free of concave corners and a directional etching process is applied to a hole-type resist pattern. FIGS. 11A and 11B illustrate an exemplary directional etching process. FIG. 12 and FIGS. 13A-18A and 13B-18B illustrate top and cross-sectional views of a device 200' during various manufacturing steps according to a second embodiment of the method 100, wherein a hole-type resist pattern is formed according to geometry and placement of device features and operations 106 and 108 of the method 100 are skipped. FIGS. 19A-27A and 19B-27B illustrate top and cross-sectional views, respectively, of a device 200" during various manufacturing steps according to a third embodiment of the method 100, wherein a hole-type hard mask pattern is formed according to geometry and placement of device features, and the directional etching process is applied to the hole-type hard mask pattern. In various embodiments, a resist pattern and a hard mask pattern may receive the directional etching individually or jointly during photolithography processes. For example, photolithography processes may treat resist patterns only, hard mask patterns only, or both resist patterns and hard mask patterns according to embodiments of the method 100. The method 100 is described below by referring to FIG. 2 and FIGS. 3A-10A and 3B-10B.

Figure 3A:
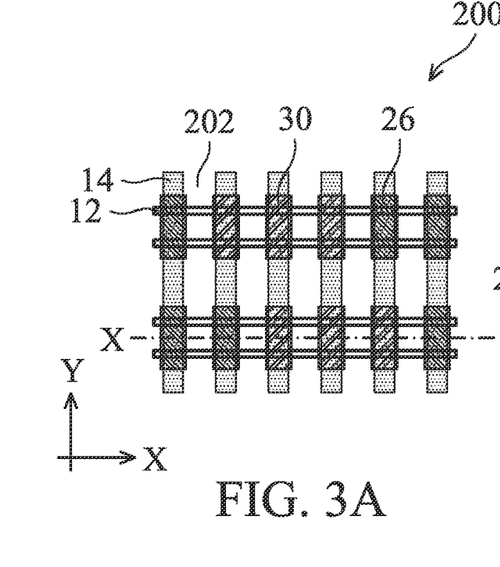
FIGS. 3A, 4A, 5A, 6A, 7A, 8A, 9A, and 10A illustrate top views of a device during various stages of manufacturing according to the method in FIG. 2 in accordance with some embodiments.
Figure 3B:
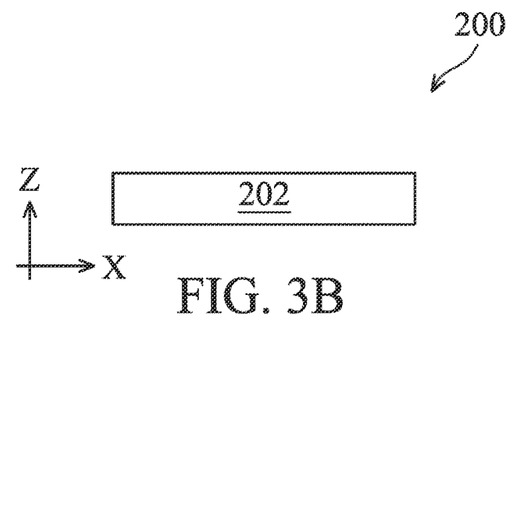
FIGS. 3B, 4B, 5B, 6B, 7B, 8B, 9B, and 10B illustrate cross-sectional views of a device during various stages of manufacturing according to the method in FIG. 2 in accordance with some embodiments.

At operation 102, the method 100 (FIG. 2) provides a substrate 202 (FIGS. 3A and 3B). In various embodiments, the substrate 202 includes one or more material layers and may be in an intermediate step of a fabrication process to form the device 200. The device 200 may be an IC, or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The device 200 may include three-dimensional devices and multi-gate devices such as double gate FETs, FinFETs, tri-gate FETs, omega FETs, Gate-All-Around (GAA) devices, and vertical GAA devices. In an embodiment, the substrate 202 is a semiconductor substrate (e.g., wafer). In an embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

The device 200 may be substantially similar to the device 10 of FIG. 1 in many regards. The device 200 includes a plurality of active regions 12 oriented lengthwise along the X direction and a plurality of gate structures 14 oriented lengthwise along the Y direction perpendicular to the X direction. A FET (e.g., a FinFET) is formed at each intersection of the active regions 12 and the gate structures 14. The regions 30 are features of the FETs that require further treatments (e.g., an ion implantation), and the regions 26 are features of the FETs that may not require further treatments received by the regions 30.

Figure 4A:
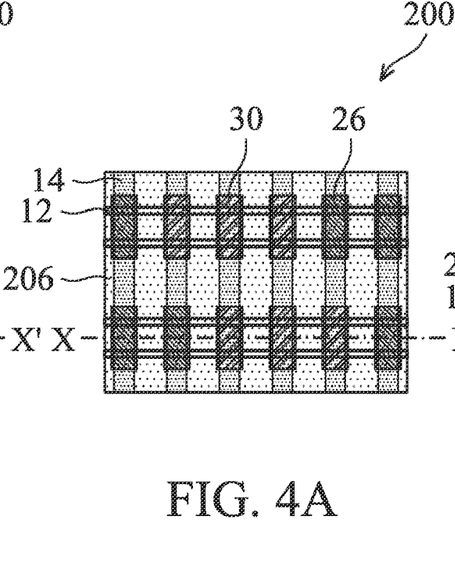
Figure 4B:
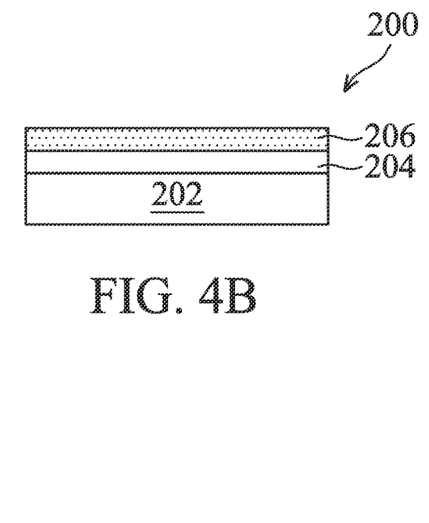

At operation 104, the method 100 (FIG. 2) forms a patterning layer over the substrate 202. The patterning layer may further include multiple material layers. In the present embodiment as shown in FIGS. 4A and 4B, the operation 104 forms a hard mask layer 204 over the substrate 202, and a resist layer 206 over the hard mask layer 204. In various embodiments, other material layers may be added between the resist layer 206 and the hard mask layer 204. Also, in some embodiments, other material layers may be added between the hard mask layer 204 and the substrate 202.

The hard mask layer 204 may comprise amorphous silicon (a-Si), silicon oxide, silicon nitride (SiN), titanium nitride (TiN), silicon oxynitride (SiON), silicon carbon nitride (SiCN), or other suitable material or composition; and may be formed by chemical vapor deposition (CVD), low pressure chemical vapor deposition (LPCVD), plasma enhanced chemical vapor deposition (PECVD), physical vapor deposition (PVD), atomic layer deposition (ALD), or other suitable deposition method.

In an embodiment, the resist layer 206 is formed by a spin coating process followed by a soft baking process. The resist layer 206 can be a positive resist or a negative resist. A positive resist is normally insoluble in a resist developer, but is made soluble by exposure to a radiation such as a deep ultraviolet (DUV) ray or an extreme ultraviolet (EUV) ray. One exemplary positive resist material is chemically amplified resist (CAR). A negative resist has the opposite behavior—normally soluble in a resist developer, but is made insoluble by exposure to a radiation, such as a DUV ray or an EUV ray. One exemplary negative resist is a polymer which forms intra-molecular and/or intermolecular cross links when irradiated, such as a polymerization of Ethyl(α-hydroxy)acrylate (EHMA) and methacryl acid (MAA).

Figure 5A:
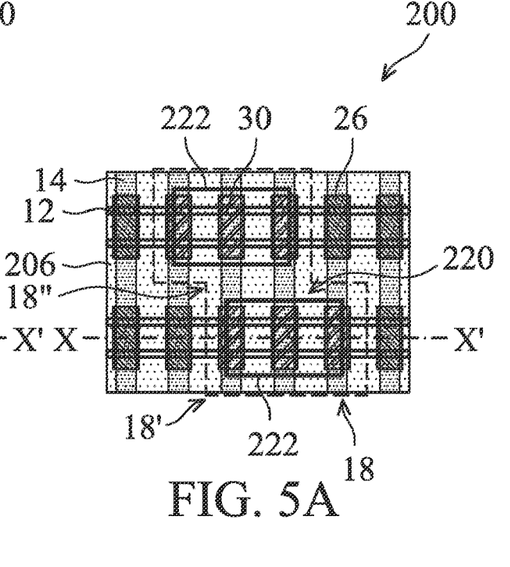
Figure 5B:
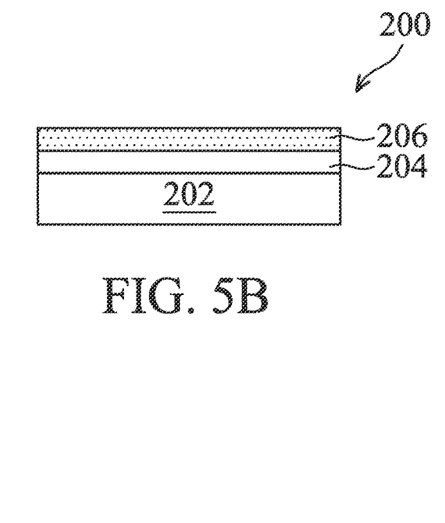

At operation 106, the method 100 (FIG. 2) provides a target pattern 18 to form in the patterning layer (FIGS. 5A and 5B). The target pattern 18 corresponds to a hole-type pattern with at least one opening. In the illustrated embodiment, the target pattern 18 includes one opening. If the patterning layer is patterned based on the target pattern 18, the opening formed will fully expose the regions in the substrate 202 that require further treatments (e.g., regions 30), while keep other regions (e.g., regions 26) remain covered under the patterning layer. Due to the geometry and placement of the regions 26 and 30, the opening defined in the target pattern 18 has multiple convex corners 18' and at least one concave corner 18". If the opening is transferred to the patterning layer, both convex corners and concave corners may become rounded due to optical effects and/or etching bias during the photolithography processes. The rounded corner from the concave corner 18" would bring the contour of the opening closer to the regions 26, therefore diminishing the design margin.

Still referring to FIGS. 5A and 5B, at operation 108, the method 100 (FIG. 2) transforms the target pattern 18 into a modified pattern, such as the pattern 220 in the illustrated embodiment. The opening defined in the target pattern 18 is decomposed into multiple openings (or holes) 222 in the pattern 220. The openings 222 are free of concave corners. For example, the openings may have shapes such as a circle, a square, or a rectangle, in some embodiments. The openings 222 in the modified pattern 220 partially cover the area of the opening defined in the target pattern 18. The openings 222 as a whole partially expose the regions 30.

Figure 6A:
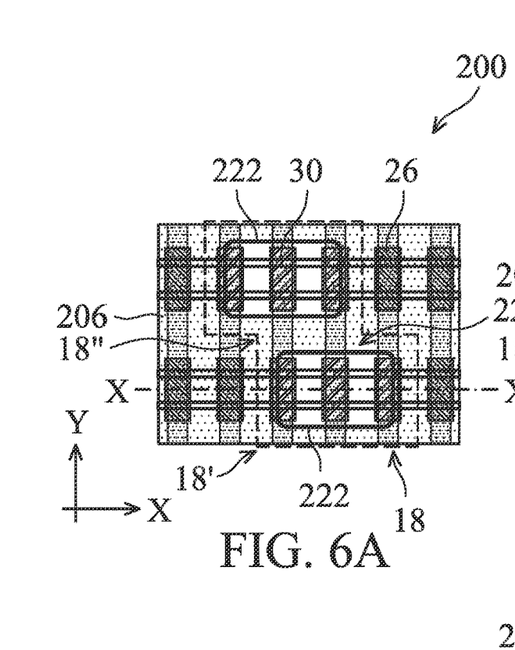
Figure 6B:
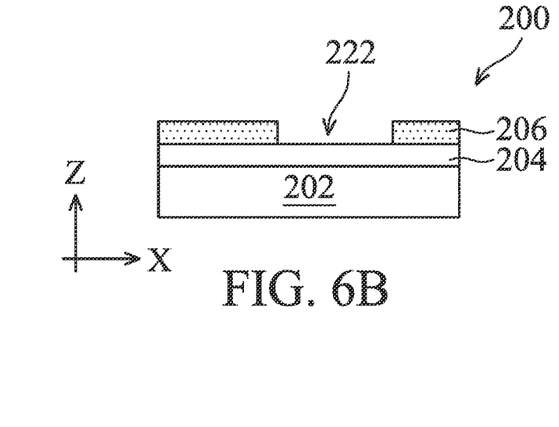

At operation 110, the method 100 (FIG. 2) forms one or more hole-type patterns in the patterning layer and the one or more hole-type patterns include the pattern 220 (FIGS. 6A and 6B). In the illustrated embodiment, the openings 222 in the pattern 220 are transferred to the resist layer 206. For the sake of simplicity, the respective openings formed in the resist layer 206 are still referred to as the openings 222. In an embodiment, patterning the resist layer 206 includes exposing the resist layer 206 to a radiation, post-exposure baking, developing the resist layer 206 in a resist developer, and hard baking thereby removing exposed portion (or unexposed in the case of negative resist) of the resist layer 206. The remaining portion of the resist layer 206 becomes a resist pattern having the openings 222. The openings 222 may have a shape resembling a rectangle in a top view. Due to optical effects of the exposing process among other factors, the corners of the openings 222 become rounded in the top view when formed in the resist layer 206. However, the openings 222 have only convex corners; therefore the rounded corners may not deteriorate the design margin between the openings 222 and the regions 26. Each opening 222 may have substantially the same dimensions. Upon the positions and dimensions of the openings 222, in an embodiment, each opening 222 fully exposes at least one region 30; in another embodiment, each opening 222 exposes at least one region 30 and partially expose at least another region 30; in yet another embodiment, each opening 222 only partially exposes one or two regions 30.

Figure 7A:
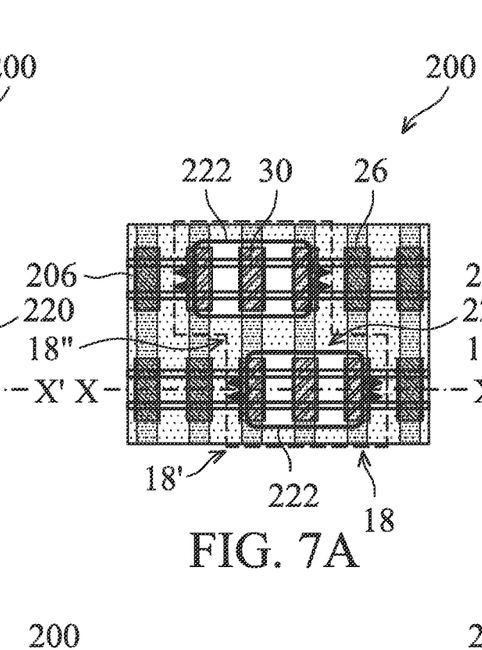
Figure 7B:
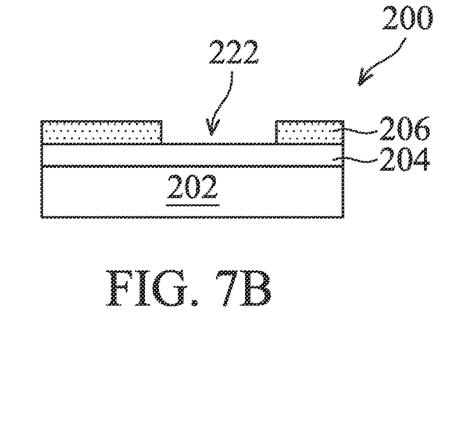

At operation 112, the method 100 (FIG. 2) applies a directional etching along a direction to the inner sidewalls of the openings 222. Referring to FIGS. 7A and 7B, in the illustrated embodiment, the region 30 extends lengthwise along the Y direction, and the directional etching is applied along the X direction perpendicular to the Y direction. In some embodiments, the directional etching is selective to the resist layer 206 and does not etch (at least insignificantly) the hard mask layer 204.

The inner sidewalls of the openings 222 are expanded along the direction of the directional etching, which is in a plane parallel to the top surface of the substrate 202. In various embodiments, the directional etching also has a vertical component, i.e., along the Z direction that is normal to the top surface of the substrate 202. In an embodiment, the operation 112 may include a slanted plasma etching process that is biased towards the X or Y direction. Examples of slanted plasma etching process are illustrated in FIGS. 11A and 11B. Referring to FIG. 11A, the plasma ion beam 250 is tilted away (slanted) from the direction Z, and has an effective horizontal component 252 and an effective vertical component 254. The plasma ion beam 250 may include argon ions in an embodiment. Alternatively, the plasma ion beam 250 may include helium, silane, methane, oxygen, nitrogen, carbon dioxide, or combinations thereof. The device 200 may be mounted on a wafer stage and is scanned along the X direction, the Y direction, or another direction perpendicular to the Z direction. The ion beam 250 remains at the same angle (or angular distribution) while the wafer stage is moved. In the example shown in FIG. 11A, the ion beam 250 has a unimodal angular distribution. In the example shown in FIG. 11B, the ion beam 250 has a bimodal angular distribution wherein the ion beam 250 etches the resist pattern 206 along two directions simultaneously. By tuning the incident angle and angular distribution of the ion beam 250, the horizontal (along the X and/or Y direction) etching rate can be well controlled.

Figure 8A:
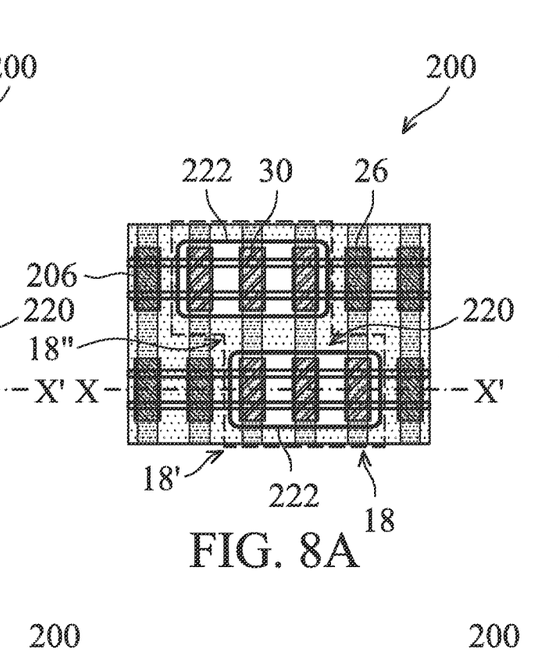
Figure 8B:
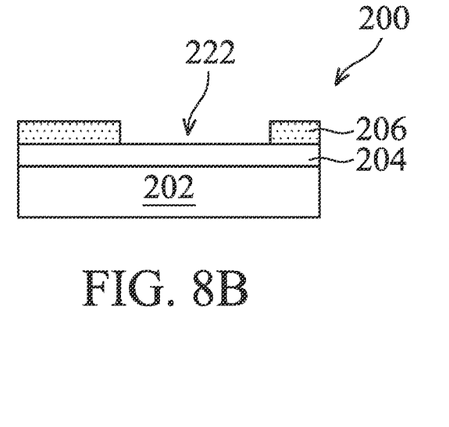

Referring to FIGS. 8A and 8B, after the directional etching, the openings 222 are expanded in the direction of the directional etching. The openings 222 after the expansion may also be referred to as the expanded openings 222 or the elongated openings 220. In some embodiments, the expanded openings 222 have substantially the same dimensions. In some embodiments, each expanded opening 222 is a substantially rectangular shape with rounded corners in the top view. Further, each expanded opening 222 may have a centerline extending lengthwise along the direction of the directional etching, while the centerlines of at least two expanded openings 222 are not aligned (i.e. not in collinearity), such as the two illustrated expanded openings 222 shown in FIG. 8A. Some of the expanded openings 222 may adjoin each other after the expansion, or remain isolated. In the illustrated example in FIG. 8A, the two expanded openings 220 remain isolated from each other.

Compared with the opening defined in the target pattern 18, the expanded openings 222 as a whole expose only a portion of the opening defined in the target pattern 18. Portions of the substrate 202 between the expanded openings 222 remain covered by the patterning layer. Meanwhile, in some embodiments, the expanded openings 222 as a whole fully expose the regions 30. Each of the regions 30 is fully exposed in one of the openings 222 and is able to receive further treatments through the openings 222 in subsequent operations. Since there are no concave corners in the expanded openings 222, the design margin is maintained and the pattern fidelity is enhanced.

Figure 9A:
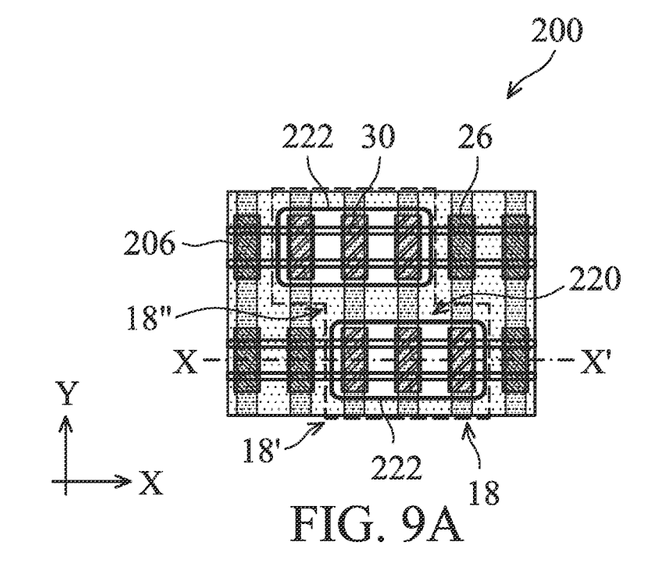
Figure 9B:
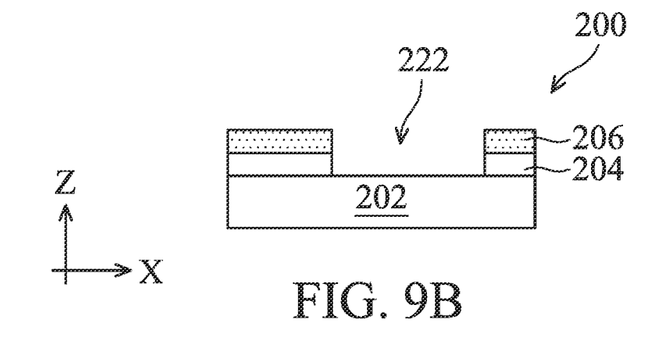

Referring to FIGS. 9A and 9B, the operation 112 may further include a process to transfer the expanded openings 222 in the resist layer 206 to the hard mask layer 204. The hard mask layer 204 is etched with the patterned resist layer 206 as an etch mask. For example, the hard mask layer 204 may be etched using a wet etching process, a dry etching process, an atomic layer etching process, or other suitable etching processes. The resist layer 206 may be partially consumed during this etching process. Remaining portions of the resist layer 206, if any, may be removed, for example, by a resist stripping process.

Figure 10A:
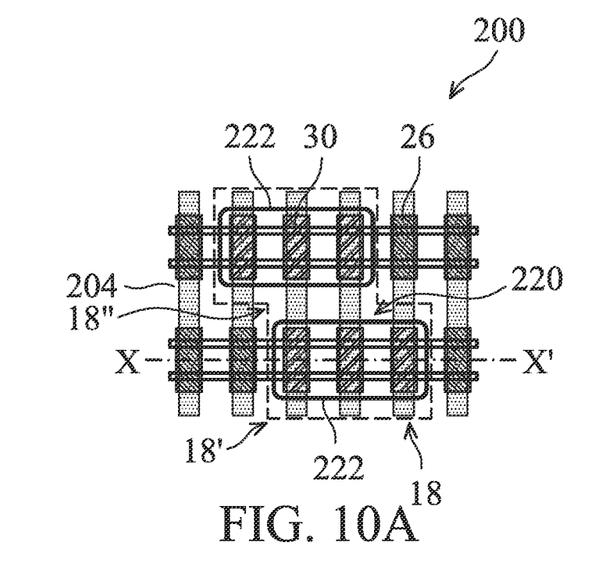
Figure 10B:
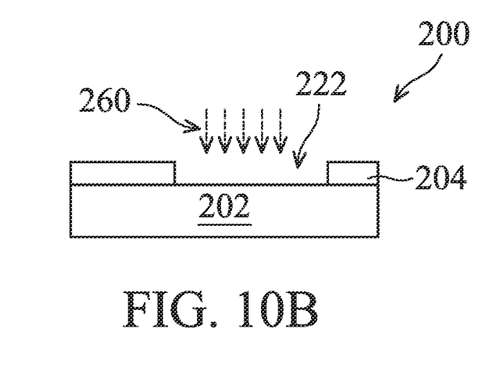
Figure 11A:
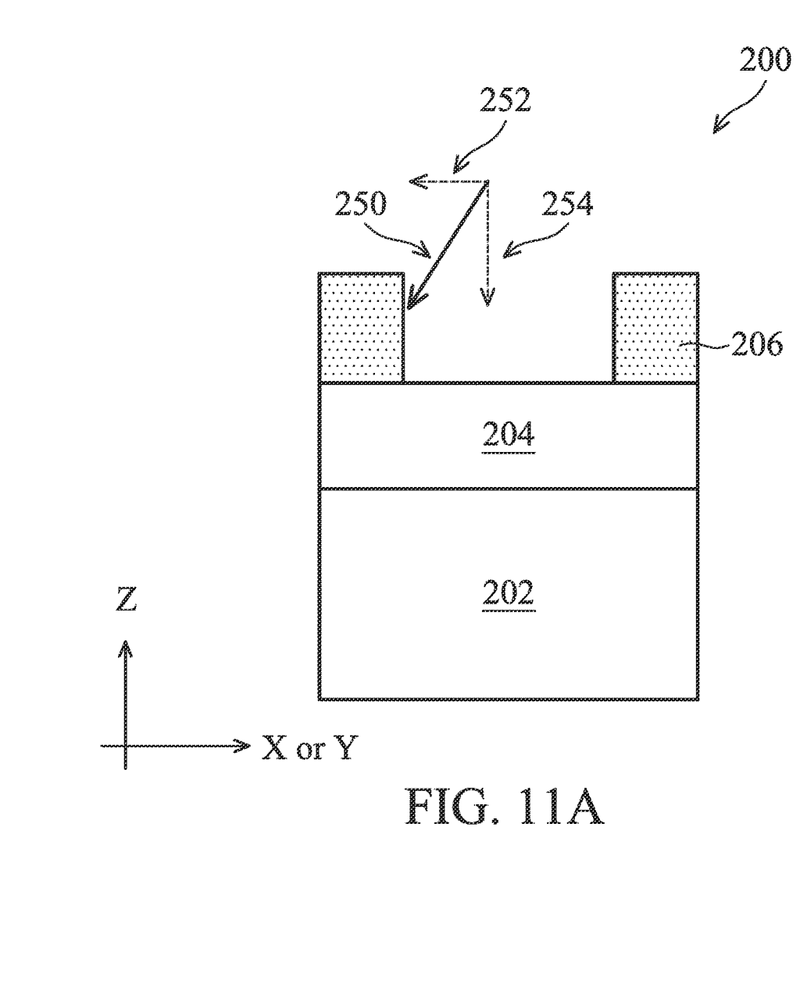
FIGS. 11A and 11B illustrate cross-sectional views of a device during a directional etching process according to an embodiment of the present disclosure.
Figure 11B:
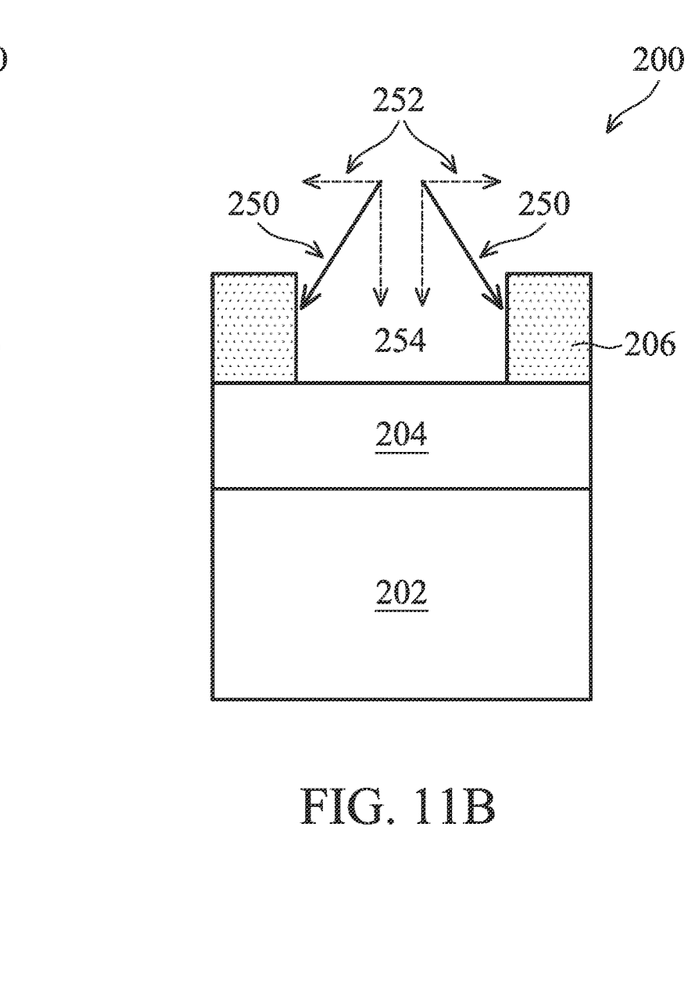

At operation 114, the method 100 (FIG. 2) uses the expanded openings 222 in the hard mask layer 204 for further treatments to the regions 30 (FIGS. 10A and 10B). In some embodiments, the method 100 uses the patterned hard mask layer 204 as an ion implantation mask for implanting dopant 260 into the regions 30. The regions 26 are covered by the hard mask layer 204 and remain substantially free of dopant 260. In another embodiment, the method 100 (FIG. 2) uses the patterned resist layer 206 as an ion implantation mask. For example, the method 100 may form the resist layer 206 over the substrate 202 without the hard mask layer 204. After the resist layer 206 has been exposed and developed, it is further treated with the directional etching processes discussed above. Thereafter, the patterned resist layer 206 is used as a masking element in an ion implantation process to the substrate 202.

FIG. 12 and FIGS. 13A-18A and 13B-18B illustrate top and cross-sectional views of the device 200' during various manufacturing steps according to a second embodiment of the method 100, wherein operation 106 and operation 108 of the method 100 are skipped. Many respects of this embodiment are similar to those described with respect to FIG. 1 and FIGS. 3A-10A and 3B-10B.

Figure 12:
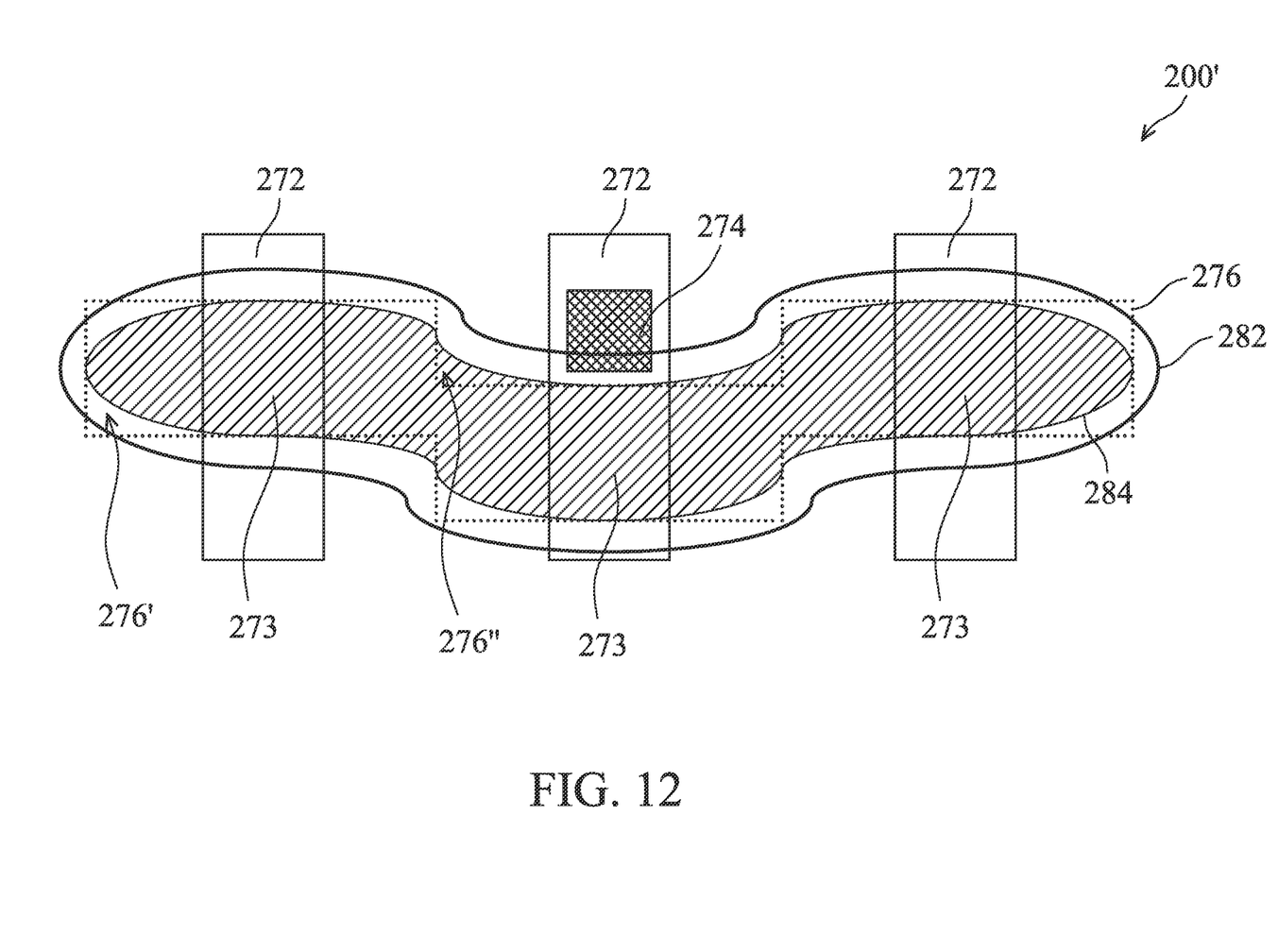
FIG. 12 illustrates another integrated circuit design according to an embodiment of the present disclosure.

Referring to FIG. 12, the device 200' includes a plurality of gate structures 272 oriented lengthwise along the Y direction. In an embodiment, each gate structure 272 has a gate segment 273 that requires further treatment. The further treatment may be a gate cut process that removes the gate segment 273 from the corresponding gate structure 272 and divides the gate structure 272 into multiple disjointed segments. In some designs, one or more gate structures 272 may have extra features, such as a gate contact 274 in the illustrated example in FIG. 12. The gate contact 274 may be a feature to remain unchanged during a gate cut process. To implement the device 200', one approach is to form a masking element that covers the gate stacks 272 and the gate contact 274 outside the gate segments 273, while exposing and processing the gate segments 273 through openings in the masking element (i.e., the box 276 represents an opening in a masking element). The gate contact 274 is an area that the box 276 may not touch. To fit in the adjacent features, the box 276 may include multiple right-angle convex corners 276' and at least one right-angle concave corner 276". The shape of the box 276 represents an example target pattern to be formed through photolithography processes. Due to optical effects and/or etching bias during the photolithography processes, the masking element typically does not conform to the target pattern exactly. As an example, a masking element may include a resist layer and a hard mask layer. The contour 282 represents the opening formed in the resist layer after resist exposure and development (i.e. an ADI (after development inspection) contour). The contour 284 represents the opening formed in the hard mask layer after transferring the opening in the resist layer to the hard mask layer (i.e., an AEI (after etch inspection) contour). Both contours 282 and 284 of the actual openings formed in the masking element have rounded corners in the top view. Especially for the contour 284 in the hard mask layer, since the further treatment to gate segments 273 may use the patterned hard mask layer as an etching mask, the gate contact 274 needs to stay outside of the contour 284. A rounded concave corner brings boundaries of the masking element closer to the features to remain covered and therefore reduces the design margin. It is desirable for methods that can form openings in the masking element being free of concave corners, while meeting the masking and unmasking requirements of specific regions (e.g., the gate contact 274 and the gate segments 273, respectively), throughout lithography patterning processes.

Figure 13A:
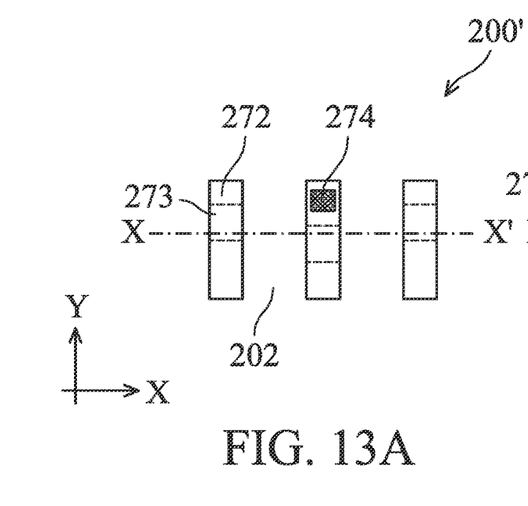
FIGS. 13A, 14A, 15A, 16A, 17A, and 18A illustrate top views of another device during various stages of manufacturing according to the method in FIG. 2 in accordance with some embodiments.
Figure 13B:
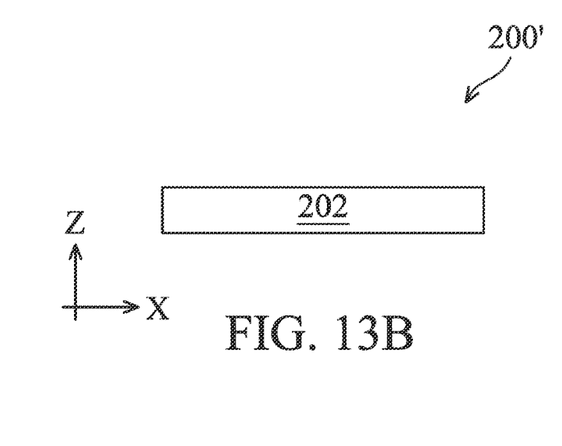
FIGS. 13B, 14B, 15B, 16B, 17B, and 18B illustrate cross-sectional views of another device during various stages of manufacturing according to the method in FIG. 2 in accordance with some embodiments.

Referring to FIGS. 13A and 13B, the method 100 provides a substrate 202 at operation 102. In various embodiments, the substrate 202 includes one or more material layers and may be in an intermediate step of a fabrication process to form the device 200'. The device 200' includes a plurality of gate stacks 272. Each gate stack 272 has a gate segment 273 to be removed in a subsequent gate cut process. One of the gate stacks 272 further includes a gate contact 274 formed thereon.

Figure 14A:
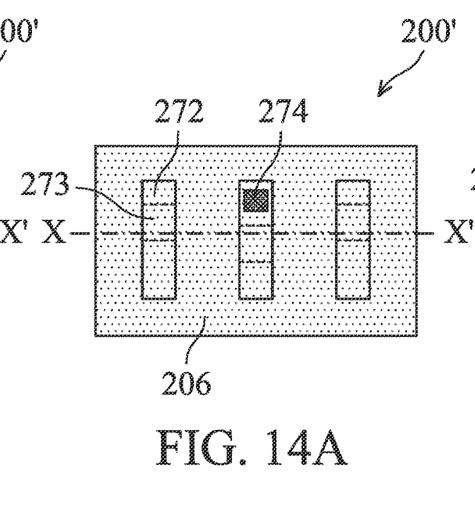
Figure 14B:
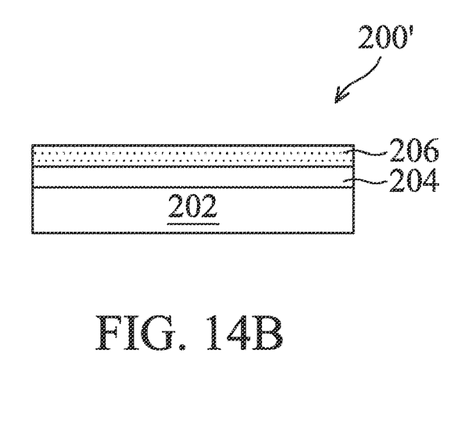

Referring to FIGS. 14A and 14B, the method 100 forms a patterning layer over the substrate 202 at operation 104. The patterning layer may further include multiple material layers, such as a hard mask layer 204 formed over the substrate 202 and a resist layer 206 formed over the hard mask layer 204.

Figure 15A:
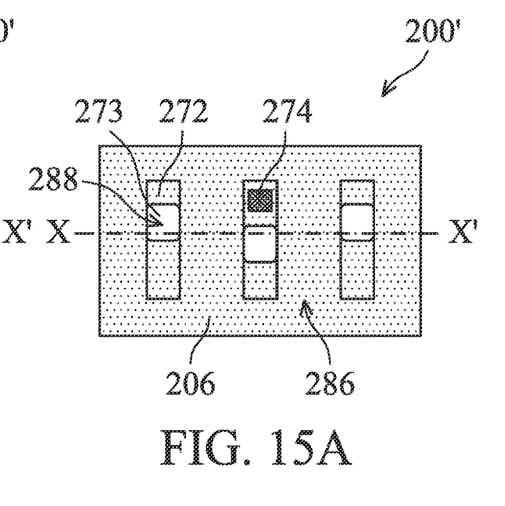
Figure 15B:
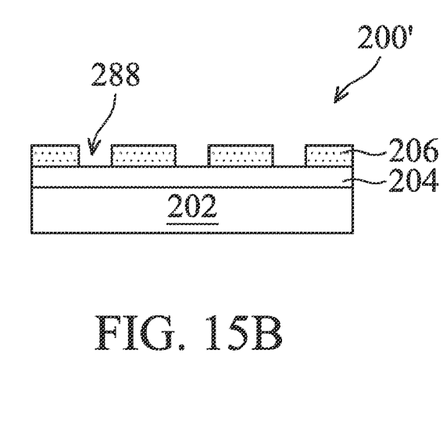

Referring to FIGS. 15A and 15B, the method 100 forms a hole-type pattern 286 that includes a plurality of openings 288 at operation 110. The operations 106 and 108 in the method 100 are optional and skipped in some embodiments. The hole-type pattern 286 may be determined based on the geometry and placement of the features (e.g., the gate segments 273) to be exposed without the need of an original target pattern to start with. In the illustrated embodiment in FIGS. 15A and 15B, the hole-type pattern 286 is first transferred to the resist layer 206. An opening 288 is formed above each gate segment 273. The opening 288 partially exposes the gate segment 273. In an example, the opening 288 is greater than the gate segment 273 along the Y direction, but narrower along the X direction. The opening 288 is free of concave corners. For example, the opening 288 may have a shape such as a circle, a square, or a rectangle in the top view. In an example, each opening 288 has substantially the same shape and dimensions, such as a rectangular with rounded corners.

Figure 16A:
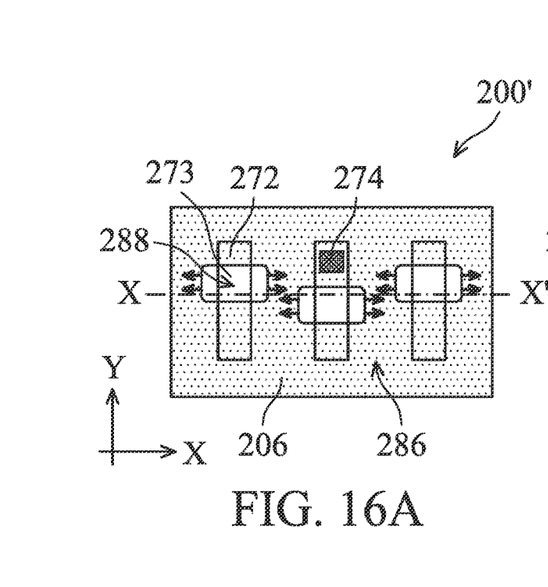
Figure 16B:
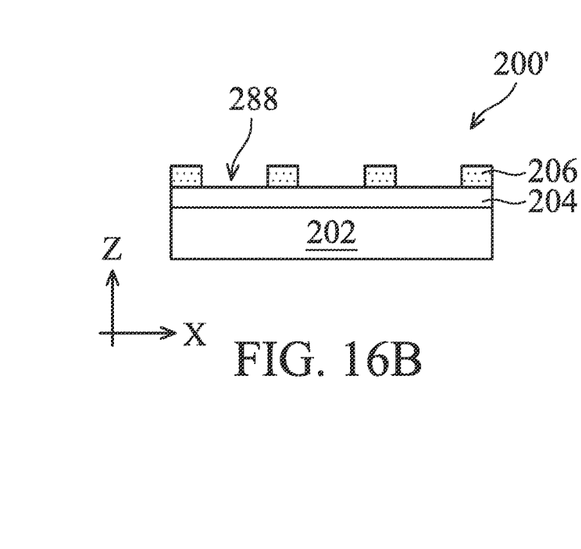

Referring to FIGS. 16A and 16B, the method 100 applies a directional etching along a direction to the inner sidewalls of the openings 288 at operation 112. In the illustrated embodiment, the gate stacks 272 extend lengthwise along the Y direction, and the directional etching is applied along the X direction perpendicular to the Y direction. After the directional etching, openings 288 are expanded in the X direction. In an example, each expanded opening 288 has a top view shape substantially resembling a rectangle with rounded corners. Further, each expanded opening 288 may have substantially similar dimensions and a centerline extending lengthwise along the X direction, while the centerlines of at least two expanded openings 288 are not aligned, due to the offset of some opening 288 caused by the gate contact 274. Each expanded opening 288 fully exposes the respective gate segment 273 underneath. Some of the expanded openings 288 may adjoin each other after the expansion, or remain isolated. In the illustrated embodiment in FIGS. 16A and 16B, the expanded openings 288 remain isolated.

Figure 17A:
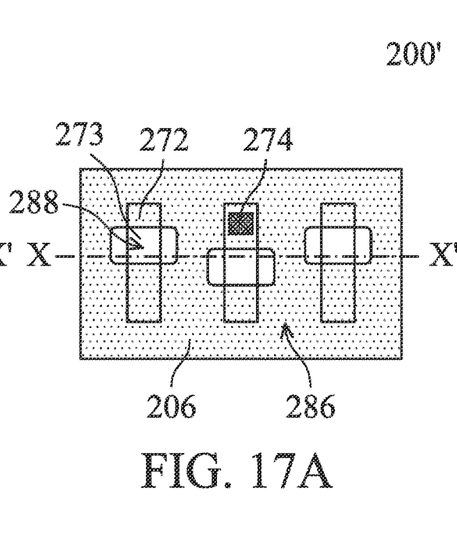
Figure 17B:
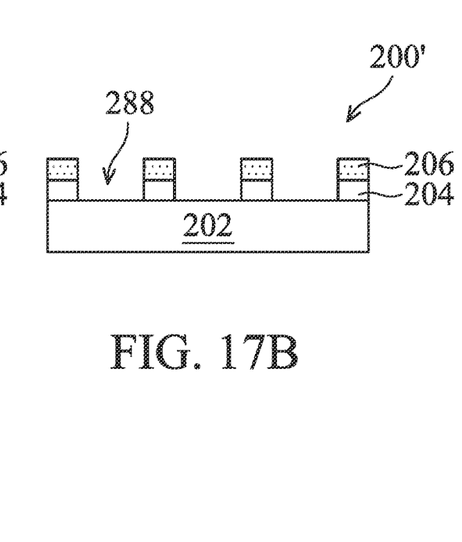

Referring to FIGS. 17A and 17B, the method 100 transfer the expanded openings 288 in the resist layer 206 to the hard mask layer 204. The hard mask layer 204 is etched with the patterned resist layer 206 as an etch mask. The resist layer 206 may be partially consumed during this etching process. Remaining portions of the resist layer 206, if any, are removed, for example, by a resist stripping process.

Figure 18A:
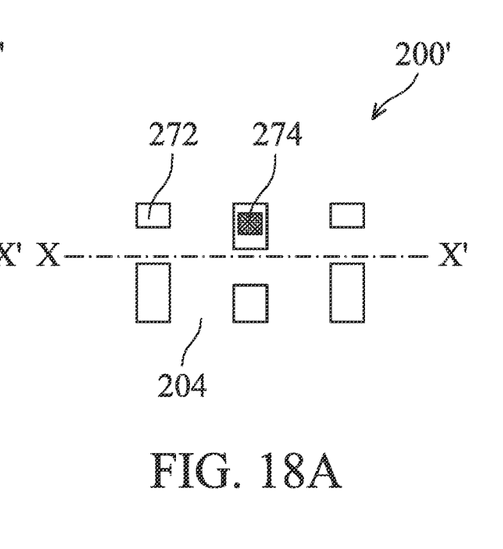
Figure 18B:
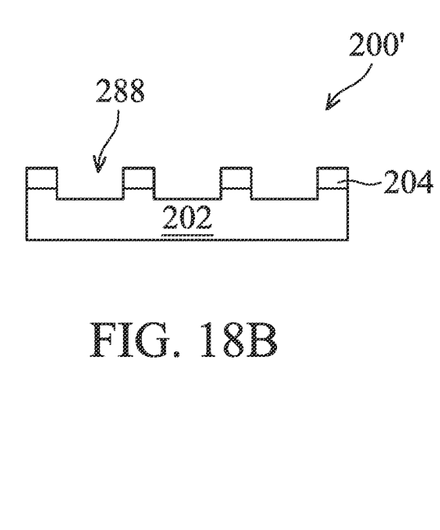

Referring to FIGS. 18A and 18B, the method 100 uses the expanded openings 288 in the hard mask layer 204 for further treatments on the gate segments 273 at operation 114, such as a gate cut process. During the gate cut process, the gate segments 273 are etched by applying suitable etchants to the gate stacks 272 through the expanded openings 288. Since there are no rounded concave corners in the expanded openings 288, a proper distance is maintained between the openings 288 and the gate contact 274, wherein pattern fidelity is enhanced.

FIGS. 19A-27A and 19B-27B illustrate top and cross-sectional views of the device 200" during various manufacturing steps according to a third embodiment of the method 100, wherein operation 106 and operation 108 of the method 100 are skipped and the directional etching process is applied to a hole-type hard mask layer instead of a resist layer. Many respects of this embodiment are similar to those described with respect to FIGS. 1 and 3A-10A and 3B-10B.

Figure 19A:
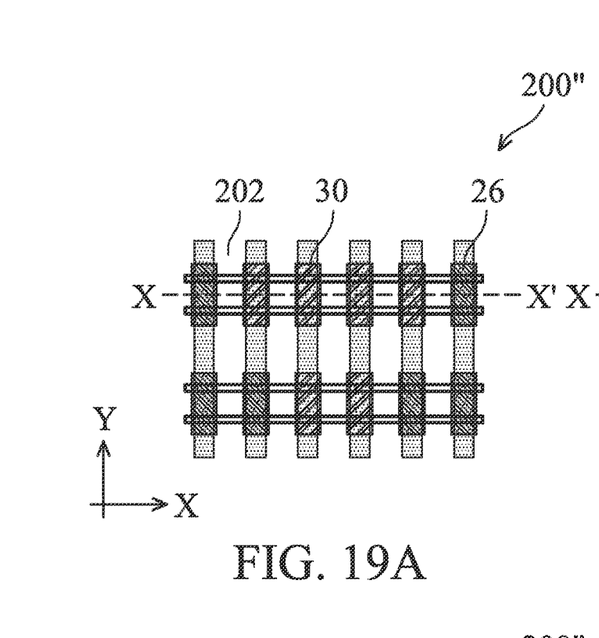
FIGS. 19A, 20A, 21A, 22A, 23A, 24A, 25A, 26A, and 27A illustrate top views of yet another device during various stages of manufacturing according to the method in FIG. 2 in accordance with some embodiments.
Figures 19B, 20B:
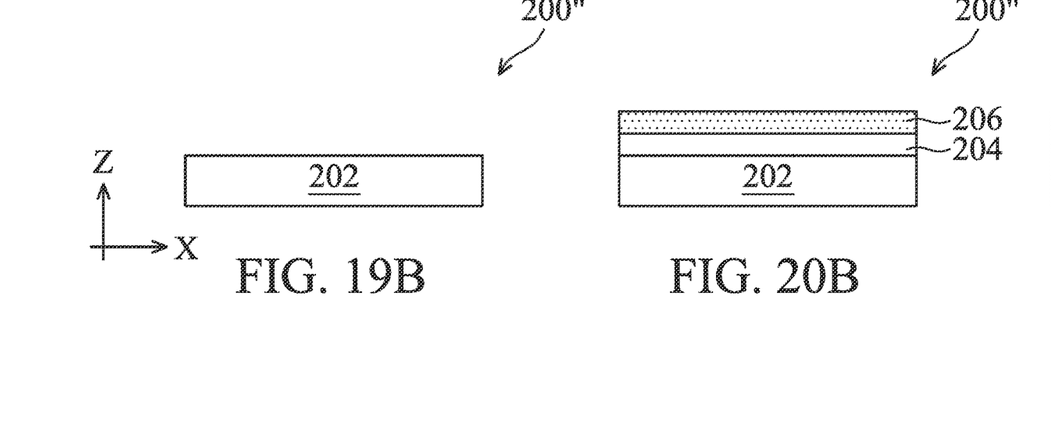
FIGS. 19B, 20B, 21B, 22B, 23B, 24B, 25B, 26B, and 27B illustrate cross-sectional views of yet another device during various stages of manufacturing according to the method in FIG. 2 in accordance with some embodiments.
Figure 20A:
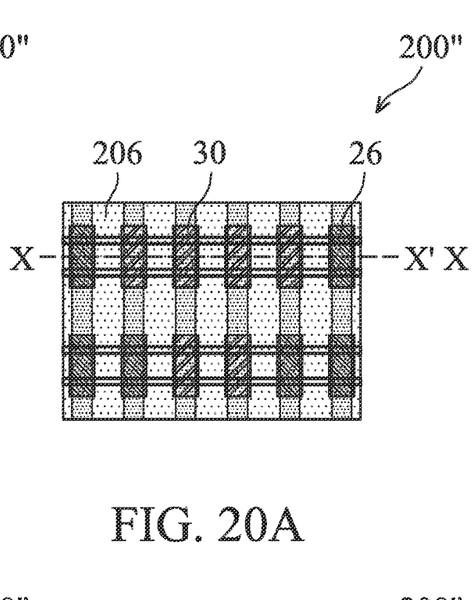

Referring to FIGS. 19A and 19B, the method 100 provides a substrate 202 at operation 102. In various embodiments, the substrate 202 includes one or more material layers and may be in an intermediate step of a fabrication process to form the device 200". The device 200" includes regions 30 to receive further treatment, such as ion implantation, and regions 26 to avoid further treatment. Referring to FIGS. 20A and 20B, the method 100 forms a patterning layer over the substrate 202 at operation 104. The patterning layer may include a hard mask layer 204 and a resist layer 206 over the hard mask layer 204.

Figure 21A:
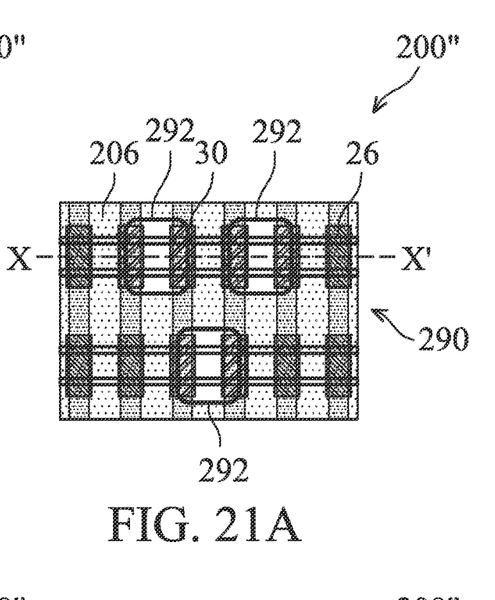
Figure 21B:
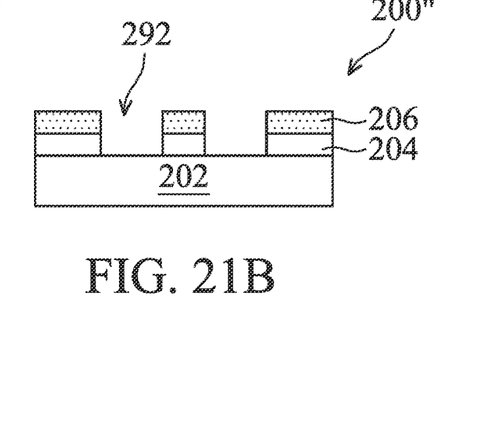

Referring to FIGS. 21A and 21B, the method 100 forms a hole-type pattern 290 in the hard mask layer 204 at operation 110. The hole-type pattern 290 includes a plurality of openings 292, each free of concave corners. In an embodiment, the hole-type pattern 290 is first formed in the resist layer 206 using photolithography processes, and then transferred to the hard mask layer 204 in an etching process. The resist layer 206 may be partially consumed during this etching process. The corners of the openings 292 are undesirably rounded due to optical effects and/or etching bias during the photolithography processes, but all as rounded convex corners while avoiding rounded concave corners that have relatively worse pattern fidelity. The openings 292 as a whole partially expose the regions 30. In the illustrate embodiment, each of the regions 30 is only partially exposed in a respective opening 292. In an example, an opening 292 partially exposes one region 30 on the edge of one sidewall and partially exposes another region 30 on the edge of an opposite sidewall.

Figure 22A:
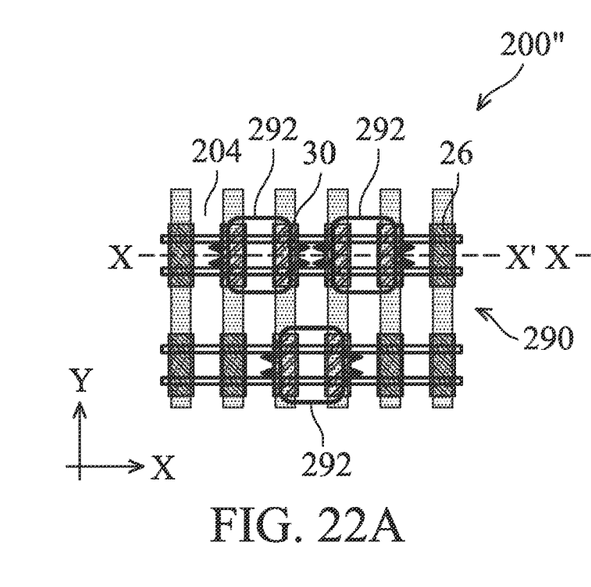
Figure 22B:
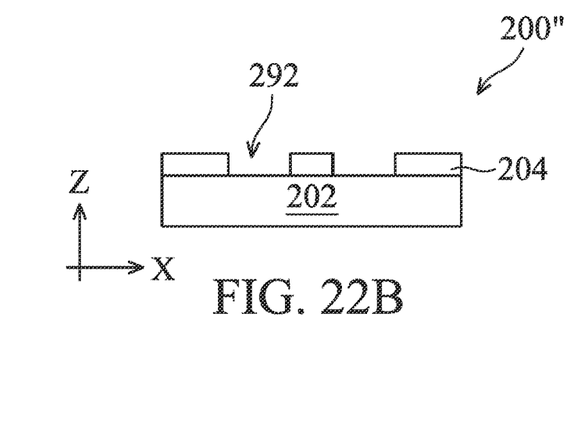
Figure 23A:
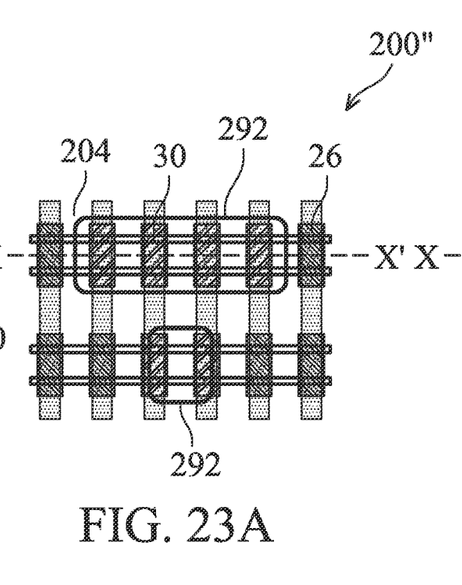
Figure 23B:
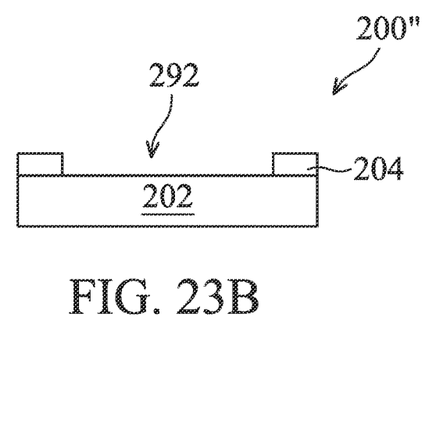

Referring to FIGS. 22A and 22B, the method 100 applies a first directional etching to the inner sidewalls of the openings 292 formed in the hard mask layer 204, at operation 112. In the illustrated embodiment, the regions 30 extend lengthwise along the Y direction, and the directional etching is applied along the X direction perpendicular to the Y direction. After the directional etching, openings 292 are expanded in the X direction. Referring to FIGS. 23A and 23B, some expanded openings 292 may merge, and some expanded openings 292 may remain isolated. The expanded openings 292 fully expose the regions 30, while each opening 292 fully exposes at least one region 30. In an example, the openings 292 in a top view have a substantially rectangular shape with rounded corners. The regions 26 remain covered by the patterning layer after the directional etching.

Figure 24A:
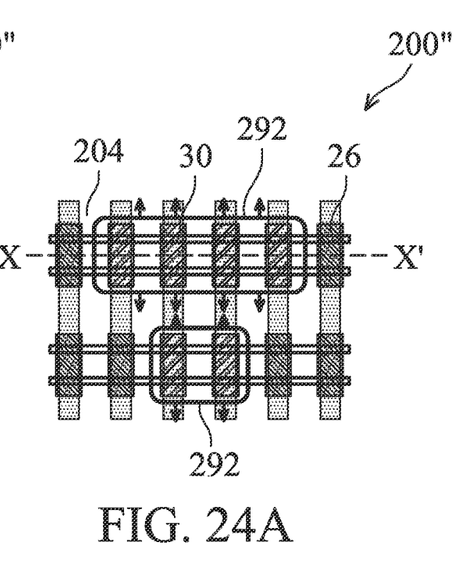
Figure 24B:
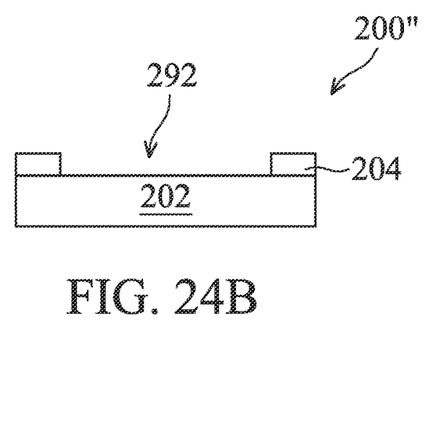
Figure 25A:
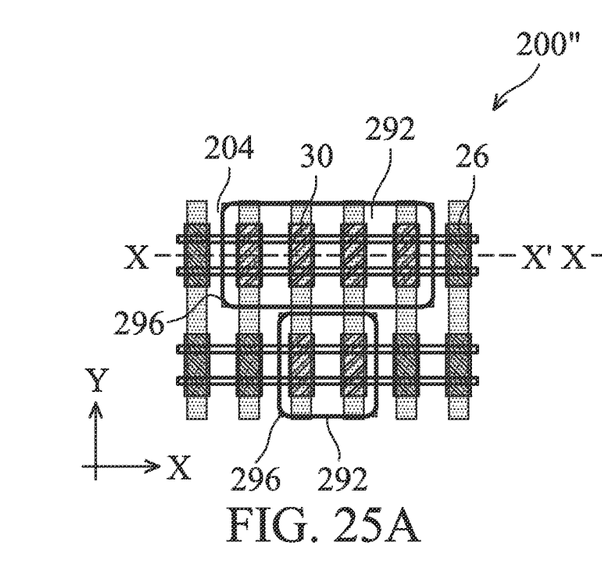
Figure 25B:
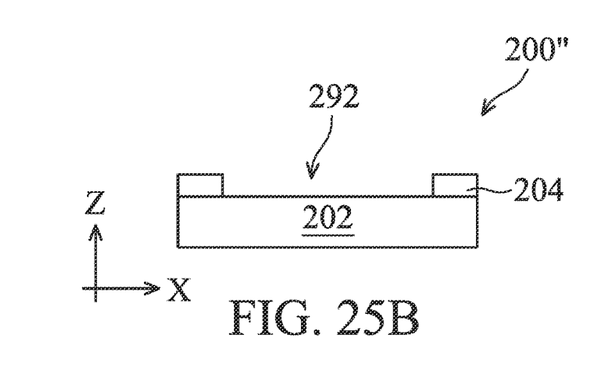
Figure 26A:
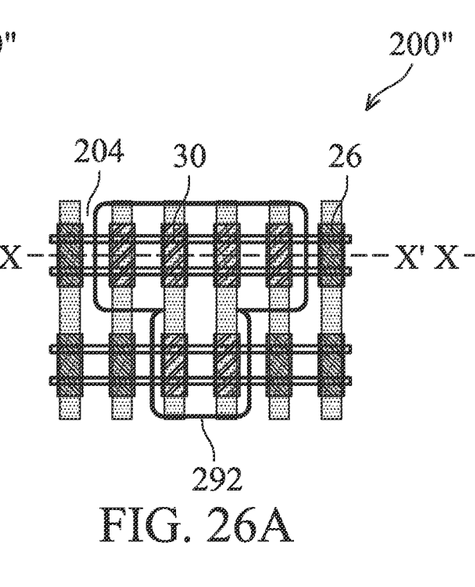
Figure 26B:
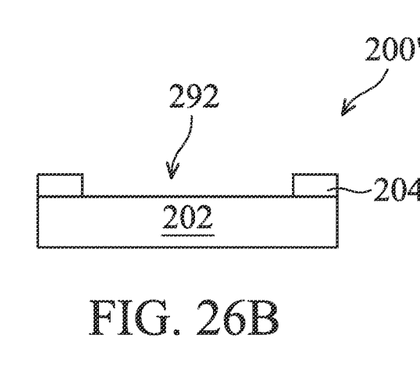

Referring to FIGS. 24A and 24B, in some embodiments, the method 100 may optionally further apply a second directional etching to the inner sidewalls of the openings 292. In the illustrated embodiment in FIG. 24A, the second directional etching is applied along the Y direction, perpendicular to the X direction. The second directional etching expands the openings 292 in the Y direction, enlarging distance between the regions 30 and the contours of the openings 292 in the Y directions for a larger process window during subsequent treatments to the regions 30. In an embodiment, the first and second directional etching to the openings 292 may be applied simultaneously. Further, each of the first and second directional etching to the openings 292 may include a vertical component, i.e., along the Z direction. The etching to the openings 292 may be selective to the hard mask layer 204 and does not etch the substrate 202. In an embodiment, the etching to the openings 292 may be implemented using a slanted plasma etching process, as discussed above. As a result of the dual directional etching to the openings 292 as illustrated in FIGS. 25A and 25B, the openings 292 may get closer to each other in the Y direction. In some embodiments, the openings 292 may merge into one larger opening, as illustrated in FIGS. 26A and 26B. Further, the corners 296 of the openings 292 may become sharper and each has a substantially 90° angle (FIG. 25A). During the first and second directional etching, the portions of the inner sidewalls of the openings 292 near the corners 296 are etched more than other portions of the inner sidewalls because they receive more etchants or more ion bombardments than the other portions. For example, they may receive etchants or ion bombardments in both of the operations of the first and second directional etching operations, while the other portions (e.g., side center) may receive etchants or ion bombardments in one, but not both, of the first and second directional etching operations. As a result, the corners 296 become sharper and each has a substantially 90° angle.

Figure 27A:
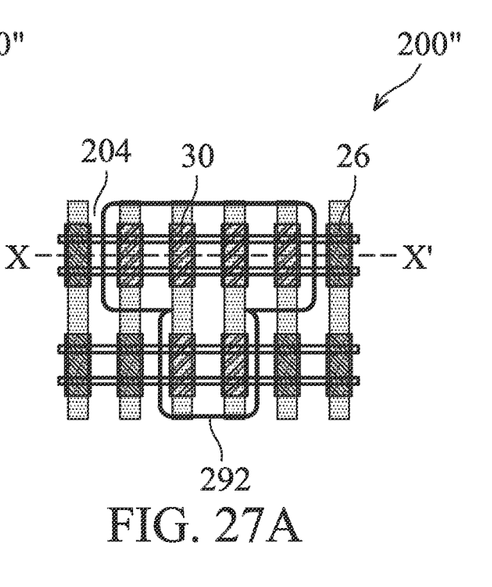
Figure 27B:
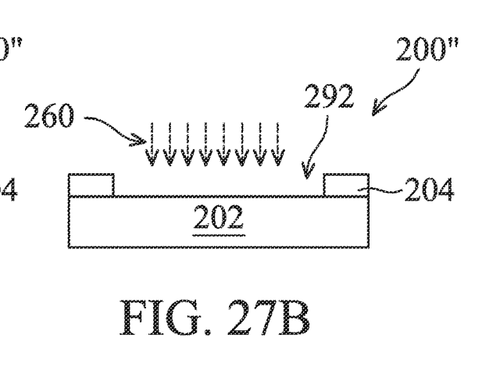

Referring to FIGS. 27A and 27B, the method 100 uses the expanded openings 292 in the hard mask layer 204 for further treatments in the regions 30 at operation 114. In some embodiments, the further treatments include ion implantation. The regions 30 receive the dopant 260 through the openings 292. The regions 26 are covered by the hard mask layer 204 and remain substantially free of the dopant 260.

It is noted that the present disclosure discusses various embodiments of the inventive concept. The various embodiments are not isolated from each other. Although not intended to be limiting, the present disclosure provides many benefits. For example, various embodiments of the present disclosure can be applied in photolithography processes to overcome concave corner rounding issues in patterns. Masking elements (either etch masks or ion implantation masks) produced by embodiments of the present disclosure are free of concave corners, which improve process windows and enhance pattern fidelity.

In one exemplary aspect, the present disclosure is directed to a method. The method includes providing a substrate and a patterning layer over the substrate, wherein the substrate includes a plurality of features to receive a treatment process; forming at least one opening in the patterning layer, wherein the plurality of features is partially exposed in the at least one opening; applying a directional etching to expand the at least one opening in a first direction, thereby forming at least one expanded opening; and performing the treatment process to the plurality of features through the at least one expanded opening. In an embodiment, the applying of the directional etching forms the at least one expanded opening in a manner such that the at least one expanded opening fully exposes the plurality of features. In an embodiment, the at least one opening is free of concave corners. In an embodiment, each of the at least one expanded opening is a substantially rectangular pattern with rounded corners. In an embodiment, the at least one expanded opening includes two or more expanded openings having centerlines extending lengthwise along the first direction, and wherein a subset of the centerlines are not aligned. In an embodiment, the at least one expanded opening includes two or more expanded openings, and wherein a subset of the two or more expanded openings adjoin. In an embodiment, the at least one expanded opening includes two or more expanded openings, and wherein a subset of the two or more expanded openings are isolated from each other. In an embodiment, the applying of the directional etching includes performing a slanted plasma etching process. In an embodiment, each of the plurality of features extends lengthwise in a second direction, and wherein the first direction is perpendicular to the second direction. In an embodiment, the plurality of features is a plurality of active regions and the treatment process includes an ion implantation. In an embodiment, the plurality of features is a plurality of gate structures and the treatment process includes a gate cut process.

In another exemplary aspect, the present disclosure is directed to a method for semiconductor manufacturing. The method includes providing a substrate, the substrate having a plurality of features to be processed; forming a patterning layer over the substrate; forming a plurality of holes in the patterning layer, the plurality of holes being free of concave corners and partially exposing the plurality of features; performing a directional etching process to inner sidewalls of each of the plurality of holes, resulting in a plurality of elongated holes, the plurality of elongated holes fully exposing the plurality of features; and performing a treatment process to the plurality of features through the plurality of elongated holes. In an embodiment, each of the plurality of elongated holes has dimensions that are substantially similar to dimensions of other elongated holes of the plurality of elongated holes. In an embodiment, each of the plurality of elongated holes is isolated from others of the plurality of elongated holes. In an embodiment, each of the plurality of holes fully exposes at least one of the plurality of features. In an embodiment, at least one of the plurality of holes fully exposes one of the plurality of features and partially exposes another one of the plurality of features.

In another exemplary aspect, the present disclosure is directed to a method for semiconductor manufacturing. The method includes providing a substrate and a patterning layer over the substrate, wherein the substrate has a region to be processed; providing a target pattern corresponding to an opening with at least one concave corner to form in the patterning layer which can fully expose the region; transforming the target pattern into a modified pattern, wherein the opening is decomposed into a plurality of holes, each of the plurality of holes being free of concave corners; forming the plurality of holes in the patterning layer according to the modified pattern; and applying a directional etching to expand each of the plurality of holes in one direction, resulting in a plurality of expanded holes, wherein the region is fully exposed in the plurality of expanded holes. In an embodiment, the plurality of expanded holes covers a smaller area than the opening. In an embodiment, wherein the plurality of holes partially exposes the region. In an embodiment, the plurality of expanded holes has a first expanded hole with a first centerline extending lengthwise along the one direction and a second expanded hole with a second centerline extending lengthwise along the one direction, and wherein the first centerline and the second centerline are free of collinearity.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate and a patterning layer over the substrate, wherein the substrate includes a plurality of features to receive a treatment process;
   forming a plurality of openings in the patterning layer, wherein the openings partially overlap with the features from a top view while a portion of the features remains covered by the patterning layer, wherein each of the openings is free of concave corners;
   performing an opening expanding process to enlarge each of the openings in the patterning layer, such that the openings in the patterning layer fully overlap with the features from the top view; and
   performing a treatment process to the features through the openings.

2. The method of claim 1, wherein the patterning layer is a hard mask layer or a photoresist layer.

3. The method of claim 1, wherein the treatment process is an ion implantation process or a gate cut process.

4. The method of claim 1, wherein the opening expanding process includes applying a first directional etching to inner sidewalls of the openings in the patterning layer along a first direction.

5. The method of claim 4, wherein the opening expanding process includes applying a second directional etching to the inner sidewalls of the openings in the patterning layer along a second direction that is perpendicular to the first direction.

6. The method of claim 1, wherein the opening expanding process includes performing a slanted plasma etching.

7. The method of claim 1, wherein after the performing of the opening expanding process, at least some of the openings in the patterning layer merge.

8. The method of claim 7, wherein after the performing of the opening expanding process, all of the openings in the patterning layer merge.

9. The method of claim 7, wherein after the performing of the opening expanding process, at least one of the openings remain isolated from the other openings in the patterning layer.

10. The method of claim 1, wherein prior to the performing of the opening expanding process, each of the openings in the patterning layer has substantially same dimensions.

11. A method for semiconductor manufacturing, comprising:
    providing a substrate, the substrate having a plurality of features to be processed;
    forming a hard mask layer over the substrate;
    forming a patterned resist layer over the hard mask layer, the patterned resist layer including a plurality of openings;
    etching the hard mask layer with the patterned resist layer as an etching mask, thereby transferring the openings to the hard mask layer, the openings in the hard mask layer partially exposing the features in the substrate;
    performing a directional etching process to inner sidewalls of each of the openings in the hard mask layer, resulting in a plurality of elongated openings in the hard mask layer, the elongated openings in the hard mask layer fully exposing the features in the substrate; and
    performing a treatment process to the features through the elongated openings.

12. The method of claim 11, wherein the features are active regions and the treatment process is an ion implantation process.

13. The method of claim 11, wherein the features are gate structures and the treatment process is a gate cut process.

14. The method of claim 11, wherein after the performing of the directional etching process, at least two of the elongated openings in the hard mask layer merge.

15. The method of claim 11, wherein at least one of the features extends lengthwise in a first direction, and wherein at least one of the elongated openings in the hard mask layer extends lengthwise in a second direction that is perpendicular to the first direction.

16. The method of claim 11, wherein prior to the performing of the directional etching process, at least one of the openings in the hard mask layer partially exposes two of the features.

17. A method for semiconductor manufacturing, comprising:
    providing a substrate and a patterning layer over the substrate, wherein the substrate has a region to be processed;
    providing a target pattern corresponding to an opening with at least one concave corner to form in the patterning layer which can fully expose the region;
    transforming the target pattern into a modified pattern, wherein the opening is decomposed into a plurality of holes, each of the plurality of holes being free of concave corners;
    forming the plurality of holes in the patterning layer according to the modified pattern; and
    applying a directional etching to expand each of the plurality of holes in the patterning layer in one direction, resulting in a plurality of expanded holes in the patterning layer, wherein the region is fully exposed in the plurality of expanded holes.

18. The method of claim 17, wherein the expanded holes in the patterning layer cover a smaller area than the opening.

19. The method of claim 17, wherein the holes in the patterning layer partially expose the region.

20. The method of claim 17, wherein the expanded holes in the patterning layer have a first expanded hole with a first centerline extending lengthwise along one direction and a second expanded hole with a second centerline extending lengthwise along the one direction, and wherein the first centerline and the second centerline are not aligned.

* * * * *